United States Patent [19]
Bula et al.

[11] 4,129,793
[45] Dec. 12, 1978

[54] HIGH SPEED TRUE/COMPLEMENT DRIVER

[75] Inventors: John Bula, Rockville, Md.; Larry C. Martin, Manassas, Va.

[73] Assignee: International Business Machines Corporation, Armonk, N.Y.

[21] Appl. No.: 807,287

[22] Filed: Jun. 16, 1977

[51] Int. Cl.² .................. H03K 17/60; H03K 17/16; H03K 19/40; G11C 8/00

[52] U.S. Cl. .................. 307/270; 307/200 B; 307/251; 307/279; 365/206; 365/230; 307/DIG. 1

[58] Field of Search .......... 307/200 B, 214, 251, 307/205, 270, 279, DIG. 1, DIG. 5; 365/206, 230, 231

[56] References Cited

U.S. PATENT DOCUMENTS

| | | | |
|---|---|---|---|
| 3,575,613 | 4/1971 | Ebertin | 307/208 X |
| 3,700,981 | 10/1972 | Masuhara et al. | 307/205 X |
| 3,868,657 | 2/1975 | Hoffman et al. | 307/DIG. 5 X |
| 3,922,647 | 11/1975 | Broeker, Jr. | 307/279 X |
| 3,938,109 | 2/1976 | Gionis et al. | 307/DIG. 4 X |
| 3,946,369 | 3/1976 | Pashley | 307/DIG. 1 X |
| 3,959,781 | 5/1976 | Mehta et al. | 307/DIG. 1 X |
| 3,964,030 | 6/1976 | Koo | 307/DIG. 5 X |
| 4,031,415 | 6/1977 | Redwine et al. | 307/DIG. 5 X |

OTHER PUBLICATIONS

Furman, "Address Buffer True/Complement Generator"; *IBM Tech. Discl. Bull.*, vol. 18, No. 11, pp. 3597–3598; 4/1976.

Anderson, "Address Encoding Circuit"; IBM Tech. Discl. Bull.; vol. 17, No. 3 pp. 796–797; 8/1974.

Gladstein et al, "Low-Power Ratioless True-Complement Buffer"; IBM Tech. Discl. Bull.; vol. 18, No. 8, pp. 2591–2592; 1/1976.

*Primary Examiner*—Larry N. Anagnos
*Attorney, Agent, or Firm*—John E. Hoel

[57] ABSTRACT

A high speed true/complement driver circuit is disclosed wherein the time interval between the address and memory select pulses are minimized by utilizing a high speed enhancement/depletion mode inverter pair followed by a clocked signal isolation stage. A pair of enhancement mode/depletion mode inverters connected in cascade configuration serves to generate the true and complement output signals which are isolated from noise at the input line by a symmetric pair of clocked FETs.

1 Claim, 2 Drawing Figures

HIGH SPEED TRUE/COMPLEMENT DRIVER

FIELD OF THE INVENTION

The invention disclosed relates to FET digital circuitry and more particularly relates to an FET circuit for generating a true and a complement of a binary signal.

BACKGROUND OF THE INVENTION

Binary, true/complement signal generation circuits are generally used to drive decoder circuits such as are required to decode the address signals for an array of storage elements. In the state-of-the-art semiconductor memory arrays, the overall storage cycle time is limited by the speed of the signal buffering circuits for address decoders, which must drive the large capacitive loads represented by the large plurality NOR decoder gates.

Prior art true/complement signal generation circuits have had their switching speed impaired by transferring this output capacitive loading back to the clock driving circuits which time the overall operation of the buffer circuit.

OBJECTS OF THE INVENTION

It is therefore an object of the invention to generate true and complement signals faster.

It is another object of the invention to generate true and complement signals without excessively loading the clocking circuits.

It is still another object of the invention to improve the input noise isolation of a true/complement generator.

SUMMARY OF THE INVENTION

These and other objects are accomplished by the high speed true/complement driver disclosed herein.

A high speed true/complement driver circuit is disclosed wherein the time interval between the address and memory select pulses are minimized by utilizing a high speed enhancement/depletion mode inverter pair followed by a clocked signal isolation stage. A pair of enhancement mode/depletion mode inverters connected in cascade configuration serves to generate the true and complement output signals which are isolated from noise at the input line by a symmetric pair of clocked FETs. The circuit imposes a reduced capacitive loading on the clocking circuit thereby permitting the use of a lower power on-chip clock.

DESCRIPTION OF THE FIGURES

These and other objects, features and advantages will be more fully understood with reference to the accompanying figures.

DISCUSSION OF THE PREFERRED EMBODIMENT

A high speed true/complement driver circuit is disclosed wherein the time interval between the address and memory select pulses are minimized by utilizing a high speed enhancement/depletion mode inverter pair T1, T2 and T3, T4 followed by a clocked signal isolation stage T5 and T6. T2 and T4 are depletion mode devices, all others being enhancement mode. A pair of enhancement mode/depletion mode inverters T1, T2 and T3, T4 are connected in cascade configuration and serve to generate the true and complement output signals which are isolated from noise at the input line by a symmetric pair of clocked FETs T5 and T6.

Figure 1:
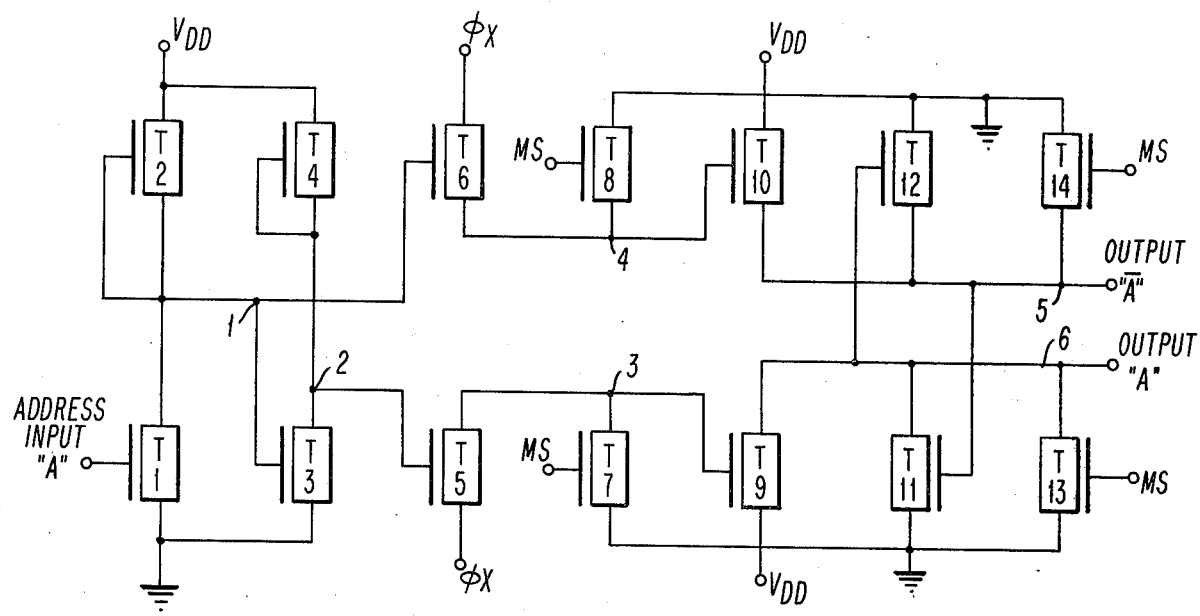
FIG. 1 is a schematic circuit diagram of the invention.
Figure 2:
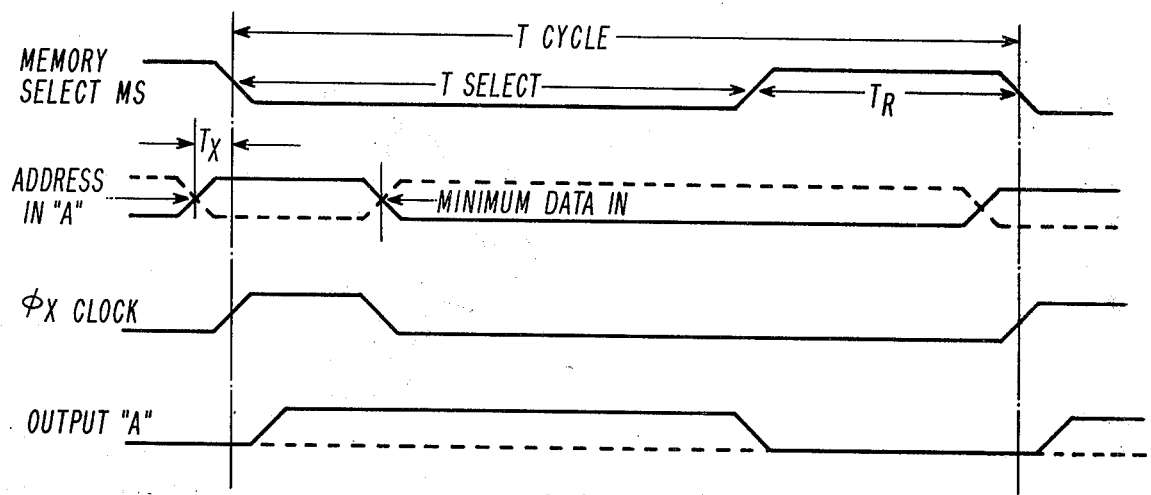
FIG. 2 is a waveform diagram for the circuit of FIG. 1.

The high speed true/complement driver circuit of FIG. 1 generates a true pulse A and a complement pulse $\bar{A}$. In the unselected mode $T_R$ (memory select high), nodes 3, 4, 5 and 6 are at ground. An address pulse applied to the gate of device T1 will set node 1 at ground and node 2 at $V_{DD}$. Node 1 will discharge through device T1, device T3 will be off, while device T4 will charge node 2 to $V_{DD}$.

In the selected mode (Tsel), memory select is set to ground and $\phi x$ clock is set to positive up-level. Device T6 will be off and device T5 will conduct driving node 3 to $V_{DD}$-$V_t$. At the same time, device T9 will conduct charging node 6 to a positive up-level. Nodes 4 and 5 will remain at ground for the remainder of the cycle. Thus, an address input at up-level (logical "1") applied to the gate of device T1 generates a true at node 6 and complement and node 5. conversely, an address input at down-level (logical "0") applied to gate of device T1 generates a true at node 5 and complement at node 6.

The true and complement outputs are capable of driving high capacitive loads because of the circuits' push-pull action. The true and complement outputs are isolated from the input, $\phi x$ clock and memory select. Address transfer is clocked by $\phi x$ signal for a short time interval and noise immunity is provided to the input for the remainder of the cycle.

The phase splitting function in the disclosed circuit is accomplished by the first and second inverters T1, T2 and T3, T4. The output of T1, T2 goes to the clocking device T6 and the output of T3, T4 goes to the clocking device T5. In this manner, the noise on the input of the gate to device T1 is isolated by virtue of the absence of a clock pulse $\phi x$ from the sources of devices T5 and T6. Furthermore, the high current driving capability of the depletion mode load inverters T1, T2 and T3, T4 permit a rapid turn-on transition at the gate of either device T5 or T6. A further feature of the disclosed circuit is the separation of the noise at the input of the circuit from the output by means of devices T5 and T6 when the clock pulse $\phi x$ is down.

This combination permits a fast true/complement signal generation while at the same time isolating the output signal from input noise and reducing capacitive loading on the clocks.

While the invention has been particularly shown and described with reference to the preferred embodiment thereof, it will be understood by those skilled in the art that the foregoing and other changes in form and details may be made therein without departing from the spirit and scope of the invention.

We claim:

1. A true/complement driver, comprising:
   a phase splitting circuit comprising a first static mode inverter having its input connected to a signal source and connected in cascade configuration with a second static mode inverter;
   a first clocked FET device having its source, drain path connected between a source of clock signals and a first gate node, and its gate connected to the output node of said second inverter;
   a second clocked FET device having its source, drain circuit connected between said source of clock signals and a second gate node, and its gate connected to the output node of said first inverter;

a first DC voltage FET switch having its gate connected to said first gate node, its drain connected to a drain voltage, and its source connected to a first output node;

a second DC voltage FET switch having its gate connected to said second gate node, its drain connected to a drain voltage, and its source connected to a second output node;

a first latching FET having its drain connected to said first output node, its source connected to ground potential and its gate connected to said second output node;

a second latching FET having its drain connected to said second output node, its source connected to ground potential and its gate connected to said first output node;

whereby said clock signal source is isolated from said first and second output nodes and from said ground potential.

* * * * *